US009188751B2

(12) United States Patent
Wang

(10) Patent No.: US 9,188,751 B2
(45) Date of Patent: Nov. 17, 2015

(54) FLIP-CHIP ASSEMBLY COMPRISING AN ARRAY OF VERTICAL CAVITY SURFACE EMITTING LASERS (VCSELSS), AND AN OPTICAL TRANSMITTER ASSEMBLY THAT INCORPORATES THE FLIP-CHIP ASSEMBLY

(71) Applicant: Avago Technologies General IP (Singapore) Pte. Ltd., Singapore (SG)

(72) Inventor: Tak Kui Wang, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/329,480

(22) Filed: Jul. 11, 2014

(65) Prior Publication Data
US 2014/0321817 A1 Oct. 30, 2014

Related U.S. Application Data

(63) Continuation-in-part of application No. 12/873,144, filed on Aug. 31, 2010.

(51) Int. Cl.
*H01S 5/022* (2006.01)
*G02B 6/42* (2006.01)
*H01S 5/42* (2006.01)

(52) U.S. Cl.
CPC ............ *G02B 6/4231* (2013.01); *G02B 6/4292* (2013.01); *H01S 5/0224* (2013.01); *H01S 5/423* (2013.01); *H01S 5/02252* (2013.01);
(Continued)

(58) Field of Classification Search
CPC .............. H01S 5/0224; H01S 5/02252; H01S 5/02284; H01S 5/423
See application file for complete search history.

(56) References Cited

U.S. PATENT DOCUMENTS 6,526,205 B1 * 2/2003 Wilson et al. .................... 385/52
6,636,653 B2 10/2003 Miracky et al.
(Continued)

FOREIGN PATENT DOCUMENTS

WO 2013054249 A3 4/2013

OTHER PUBLICATIONS

M. Hutter, H. Opperman, G. Engelmann, L. Dietrich and H. Reichl, "Precise Flip Chip Assembly Using Electroplated AuSn20 and SnAg3.5 Solder," 2006 Electronic Components and Technology Conference, Fraunhofer IZM, Berlin, Germany, pp. 1087-1094, IEEE.

*Primary Examiner* — Yuanda Zhang
*Assistant Examiner* — Michael Carter

(57) ABSTRACT

A plurality of flip-chips, each having a plurality of optoelectronic elements formed therein, are flip-chip mounted on a top surface of a substrate that is comprised of a material that is transparent to the operating wavelength of the light produced by optoelectronic elements of the flip-chips. The combination of flip-chips comprises an array of precisely-aligned optoelectronic elements. When the substrate comprising the array of optoelectronic elements is mounted on a PCB, electrical contact pads disposed on the bottom and/or top surface of the substrate are in contact with the respective electrical contact pads disposed on the top surface of the PCB to electrically interconnect the PCB with the flip-chips. Mating features on the substrate that have been precisely positioned by semiconductor fabrication steps are disposed for mating with respective mating features of a multi-optical fiber ferrule device that have been precisely formed in the ferrule device at precise locations.

28 Claims, 15 Drawing Sheets

(52) U.S. Cl.
CPC ......... *H01S5/02272* (2013.01); *H01S 5/02276* (2013.01); *H01S 5/02284* (2013.01)

(56) References Cited

U.S. PATENT DOCUMENTS

| | | |
|---|---|---|
| 6,658,041 B2 | 12/2003 | Uebbing |
| 6,670,599 B2 | 12/2003 | Wagner et al. |
| 6,800,946 B2 | 10/2004 | Chason et al. |
| 7,271,461 B2 | 9/2007 | Dutta |
| 8,399,292 B2 * | 3/2013 | Doany et al. ................. 438/106 |
| 2001/0007372 A1 | 7/2001 | Akram et al. |
| 2002/0089067 A1 | 7/2002 | Crane et al. |
| 2002/0154667 A1 | 10/2002 | Shimonaka |
| 2003/0026303 A1 | 2/2003 | Ouchi et al. |
| 2008/0013959 A1 | 1/2008 | Ishigami |
| 2011/0044369 A1 | 2/2011 | Andry et al. |
| 2012/0051685 A1 * | 3/2012 | Su et al. ......................... 385/14 |

* cited by examiner

US 9,188,751 B2

FLIP-CHIP ASSEMBLY COMPRISING AN ARRAY OF VERTICAL CAVITY SURFACE EMITTING LASERS (VCSELSS), AND AN OPTICAL TRANSMITTER ASSEMBLY THAT INCORPORATES THE FLIP-CHIP ASSEMBLY

CROSS-REFERENCE TO RELATED APPLICATIONS

The application is a continuation-in-part application of U.S. application Ser. No. 12/873,144, filed on Aug. 31, 2010, entitled "A FLIP-CHIP ASSEMBLY COMPRISING AN ARRAY OF VERTICAL CAVITY SURFACE EMITTING LASERS (VCSELSs)," which is currently pending and which is incorporated by reference herein in its entirety.

TECHNICAL FIELD OF THE INVENTION

The invention relates to semiconductor lasers, and more particularly, to a flip-chip assembly comprising an array of vertical cavity surface emitting lasers (VCSELs).

BACKGROUND OF THE INVENTION

In optical communications networks, optical transceiver and transmitter modules are used to transmit optical signals over optical fibers. The optical transceiver or transmitter module includes a laser that generates amplitude modulated optical signals that represent data, which are then transmitted over an optical fiber coupled to the transceiver or transmitter module. Various types of semiconductor lasers are typically used for this purpose, including, for example, VCSELs and edge emitting lasers, which may be further divided into subtypes that include Fabry Perot (FP) and Distributed Feedback (DFB) lasers.

Some optical transmitter or transceiver modules have only a single transmit channel comprising a single laser, which is sometimes referred to as a singlet. Other optical transmitter or transceiver modules have multiple transmit channels comprising multiple lasers. The multi-channel optical transmitter or transceiver module is commonly referred to as a parallel optical transmitter or transceiver module.

There is an ever-increasing demand for optical transmitter or transceiver modules that have increasingly larger numbers of transmit channels. Of course, increasing the number of transmit channels allows the bandwidth capacity of an optical communications network to be increased. In order to meet this demand, it is known to fabricate an array of lasers on a single semiconductor substrate of the electrical subassembly (ESA) of the module. For example, it is known to fabricate a one-dimensional or two-dimensional array of VCSELs on a single semiconductor substrate. Fabricating the VCSELs on a single semiconductor substrate allows the spacing, or pitch, between adjacent VCSELs to be decreased, which, in turn, allows the number of VCSELs that can be integrated on a single semiconductor substrate to be increased. However, the manufacturing yield for this type of semiconductor device is relatively low due to the fact that the semiconductor device is deemed defective and is discarded if even one of the VCSELs of the array is found to be defective. The relatively low manufacturing yield of this type of semiconductor device increases the overall costs of the semiconductor devices.

Because semiconductor devices that have fewer numbers of VCSELs on them can be manufactured with higher yield, and thus at reduced costs, it is known to construct an array of VCSELs by creating an array of multiple semiconductor devices that have either only a singlet VCSEL or a few VCSELs on them. This approach presents other difficulties, however, one of which is the difficulty associated with precisely aligning the VCSELs with their respective optical coupling elements. Consequently, to date, using multiple semiconductor devices having only either a singlet VCSEL or a very small number of VCSELs on them to create a larger array of VCSELs is not a viable solution.

Accordingly, a need exists for an assembly having multiple semiconductor devices with only either a singlet or a very small number of VCSELs on them that can be combined to create a precisely-aligned larger array of VCSELs.

SUMMARY OF THE INVENTION

The present invention is directed to a flip-chip assembly, and to an optical communications module that incorporates the flip-chip assembly. The flip-chip assembly comprises a substrate, at least a first set of electrically-conductive contact pads disposed on the substrate, at least a first set of electrically-conductive traces disposed on the substrate, and a plurality of flip-chips that are flip-chip-mounted in respective flip-chip mounting areas of the top surface of the substrate. The substrate is transparent to a particular wavelength of light and has top and bottom surfaces. The bottom surface of the substrate has a plurality of mating features disposed thereon at precise locations on the bottom surface of the substrate. Each mating feature is sized and shaped to mate with a respective mating feature of a multi-optical fiber ferrule device. The traces have first and second ends. The first ends of the traces are connected to respective contact pads of the first set of electrically-conductive contact pads. Each flip-chip includes a plurality of electrically-conductive contact pads that are connected to second ends of respective traces of the first set of traces. The mating of the mating features disposed on the bottom surface of the substrate with the respective mating features of the ferrule device precisely aligns the optoelectronic elements of the flip-chips with ends of respective ferrules of the ferrule device.

The optical communications module comprises the flip-chip assembly, a circuit board, and a multi-optical fiber ferrule device. The substrate is mounted on the circuit board such that the mating features disposed on the bottom surface of the substrate are exposed to mate with the mating features of the ferrule device. The multi-optical fiber ferrule device has a front side and a back side and N ferrules formed therein. The front side has the mating features thereon at particular locations that are shaped and sized to mate with the respective mating features disposed on the bottom surface of the substrate. The mating features of the ferrule device are fully mated with the respective mating features of the substrate, and the full mating of the respective mating features brings the ferrules of the ferrule device into precise alignment with respective optoelectronic elements of the flip-chips.

These and other features and advantages of the invention will become apparent from the following description, drawings and claims.

DETAILED DESCRIPTION OF ILLUSTRATIVE EMBODIMENTS

Figure 1A:
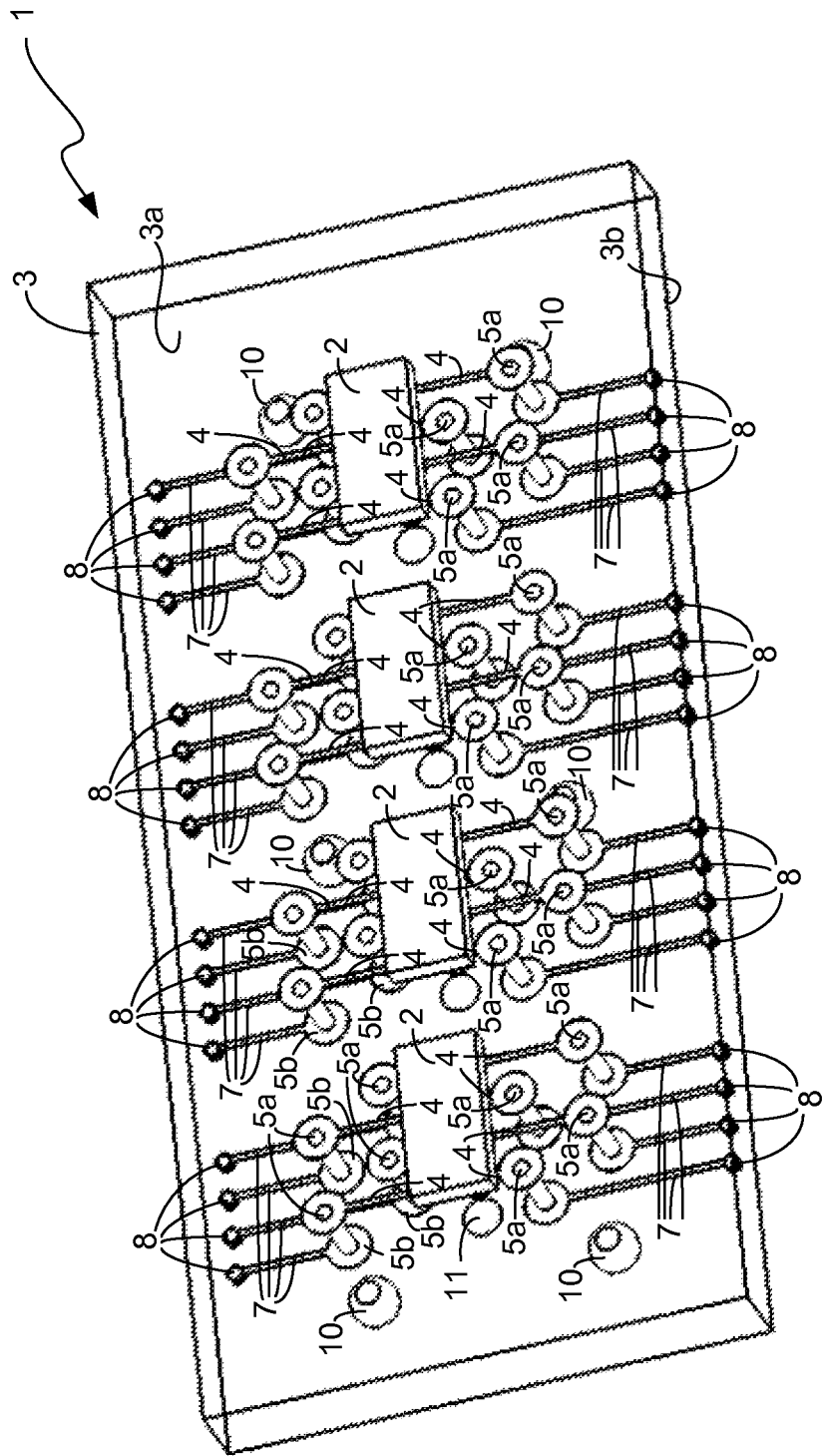
FIG. 1A illustrates a top perspective view of the VCSEL flip-chip assembly in accordance with an illustrative embodiment prior to a top surface of the assembly being covered with an encapsulation material.

In accordance with illustrative embodiments described herein, a plurality of flip-chips are flip-chip mounted on a top surface of a substrate that is comprised of a material that is transparent to the operating wavelength of the light produced by optoelectronic elements of the flip-chips. Each flip-chip has a plurality of optoelectronic elements formed therein such that the combination of flip-chips mounted on the substrate comprises an array of precisely-aligned optoelectronic elements. When the substrate comprising the array of optoelectronic elements is mounted on the PCB, electrical contact pads disposed on the bottom and/or top surface of the substrate are in contact with the respective electrical contact pads disposed on the top surface of the PCB to electrically interconnect the PCB with the flip-chips. Mating features on the substrate that have been precisely positioned by semiconductor fabrication steps are disposed for mating with respective mating features of a multi-optical fiber ferrule device that have been precisely formed in the ferrule device at precise locations. When the mating features on the substrate fully engage the respective mating features of the ferrule device, the optoelectronic elements of the array are brought into precise, fine alignment with respective ferrules formed in the ferrule device.

First ends of a plurality of optical fibers are held within respective ferrules of the ferrule device. The precision mating of the ferrule device with the substrate ensures that the ferrules of the ferrule device are precisely aligned with the respective optoelectronic elements of the flip-chips, which ensures that the first ends of the fibers are precisely aligned with the respective optoelectronic elements. Second ends of the optical fibers may be secured to one or more optical connectors, which may be pluggable connectors configured to be plugged into one or more respective optical receptacles.

Illustrative embodiments will now be described with reference to FIGS. 1A-11, in which like reference numerals represent like components, elements or features. It should be noted that features, components or elements shown in the drawings are not necessarily drawn to scale. The term "optoelectronic element," as that term is used herein, denotes either a photosensor or a VCSEL. The term "flip-chip," as that term is used herein, denotes a chip having a top surface in which apertures of optoelectronic elements exist and which is designed to be mounted with the top surface of the chip in contact with a mounting surface such that the apertures face, and are possibly in contact with, the mounting surface. In accordance with embodiments described herein, the mounting surface is a substrate that is transparent to an operating wavelength of the optoelectronic elements and the flip-chips are mounted with the top surface down on the substrate such that the apertures face the top surface of the substrate. In the case where the optoelectronic elements are VCSELs, the light produced by the VCSELs passes out of the respective apertures through the top surface of the substrate, propagates through the substrate, and exits the substrate through the bottom surface of the substrate. In the case where the optoelectronic elements are photosensors, the light passes through the bottom surface of the substrate, propagates through the substrate, exits the substrate through the top surface of the substrate, and enters the apertures of the photosensors. The term "flip-chip-mounted" is used herein to denote a flip-chip mounted on a mounting surface with the apertures of the optoelectronic elements of the chips facing the mounting surface. For ease of discussion, it will be assumed that the flip-chips are VCSEL flip-chips, each having multiple VCSELs.

Figure 1B:
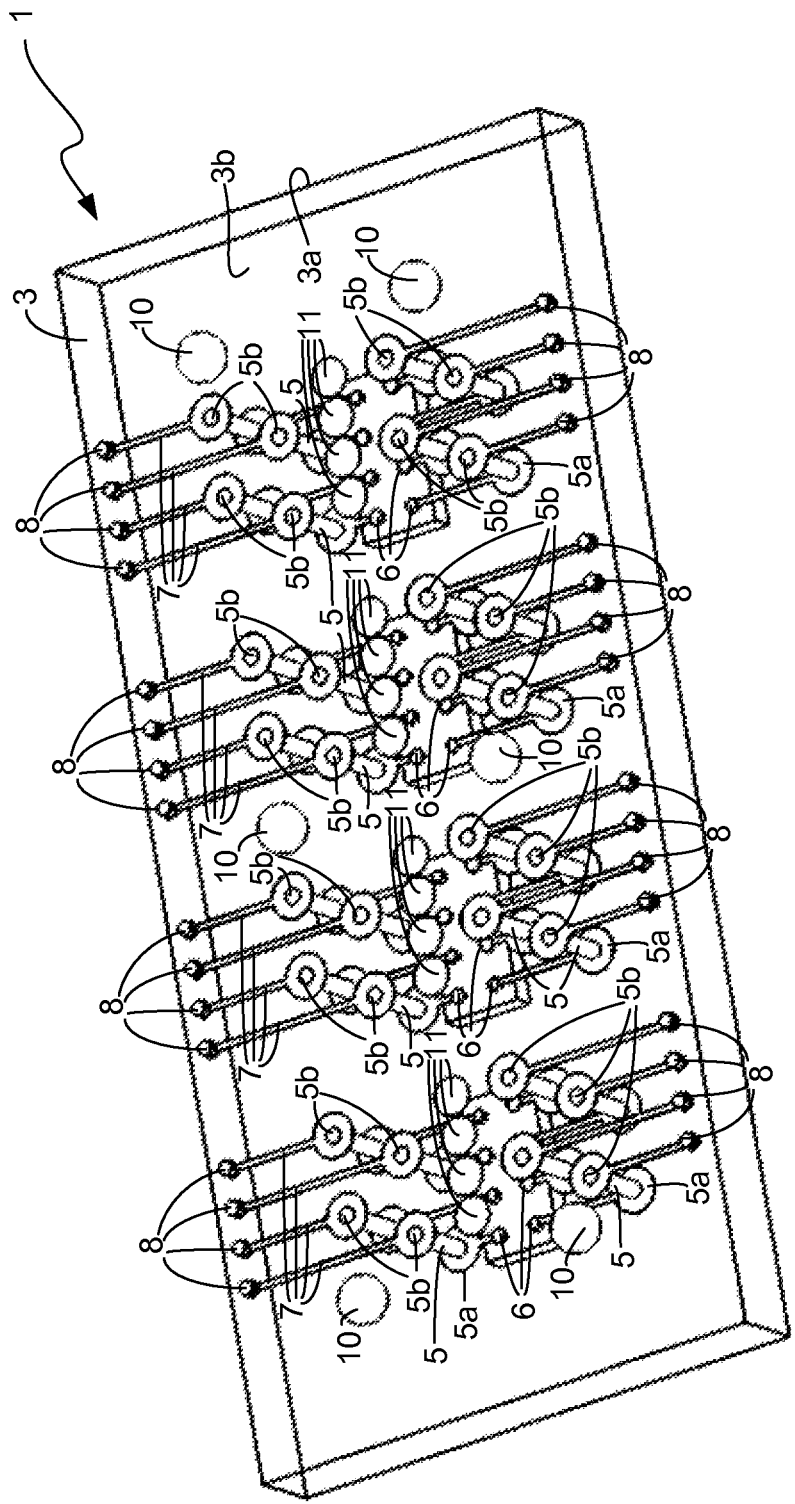
FIG. 1B illustrates a bottom perspective view of the VCSEL flip-chip assembly shown in FIG. 1A.
Figure 1C:
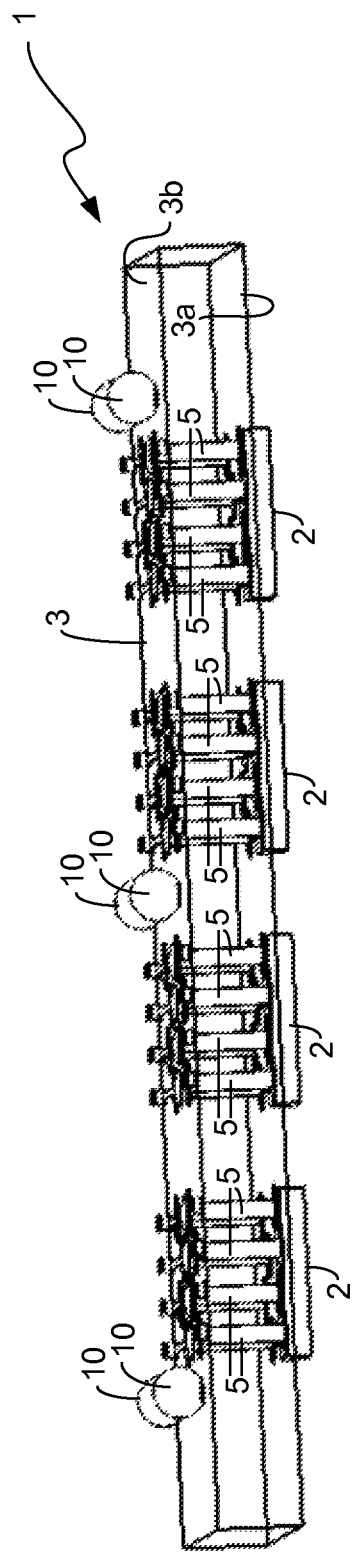
FIG. 1C illustrates a side perspective view of the VCSEL flip-chip assembly shown in FIGS. 1A and 1B.

FIG. 1A illustrates a top perspective view of a VCSEL flip-chip assembly 1 in accordance with an illustrative embodiment. FIG. 1B illustrates a bottom perspective view of the VCSEL flip-chip assembly 1 shown in FIG. 1A. FIG. 1C illustrates a side perspective view of the VCSEL flip-chip assembly 1 shown in FIGS. 1A and 1B. The VCSEL flip-chip assembly 1 comprises a plurality of VCSEL flip-chips 2 that are flip-chip mounted on a top surface 3a of a substrate 3. The substrate 3 is made of a material that is transparent to the operating wavelength of the light produced by VCSELs of the flip-chips 2. Each VCSEL flip-chip 2 has a plurality of VCSELs formed therein such that the combination of VCSEL flip-chips 2 mounted on the substrate 3 comprises an array of precisely-aligned VCSELs.

The manner in which known semiconductor fabrication processes may be used to form VCSELs at very precise locations in an integrated circuit (IC) chip is well known. The manner in which individual IC chips can be mounted relative to one another at very precise locations and with very precise orientations on a substrate is also known. The parent application discloses embodiments for accomplishing this for the VCSEL flip-chips. Therefore, persons of skill in the art will understand how to use such techniques to form VCSELs at very precise locations in flip-chips 2 and mount the flip-chips 2 at very precise locations and with very precise orientations on the substrate 3 relative to one another to achieve an array of very precisely aligned VCSELs. In accordance with embodiments described herein, such techniques are used to mount the flip-chips 2 on the top surface 3a of the substrate 3 at very precise locations and with very precise orientations relative to one another to achieve an array of VCSELs that are precisely aligned. For example, assuming for exemplary purposes that each of the VCSEL flip-chips 2 has four VCSELs and that the VCSEL flip-chip assembly 1 has four VCSEL flip-chips 2, the resulting VCSEL array would be a 1×16 array of VCSELs with the sixteen VCSELs being aligned along an imaginary line that passes through the centers of the sixteen VCSELs.

The top surface 3a of the substrate has a plurality of electrical traces 4 disposed thereon. Each of the electrical traces 4 is connected on a first end thereof to a first end 5a of a respective electrical via 5 and is connected on a second end thereof to an electrical contact pad 6 (FIG. 1B) of the respective VCSEL flip-chip 2. A bottom surface 3b of the substrate 3 has electrical traces 7 thereon. Each of the electrical traces 7 is connected on a first end thereof to a respective electrical contact pad 8 disposed on the bottom surface 3b of the substrate 3 and is connected on a second end thereof to a second end 5b of a respective electrical via 5. As will be described below with reference to the PCB shown in FIG. 3, when the VCSEL flip-chip assembly 1 is mounted on the PCB, the electrical contact pads 8 located at the edges of the substrate 3 are in contact with respect electrical contact pads of the PCB. Through all of these electrical connections 5a, 5b, 6, 7, and 8, electrical signals are delivered from the PCB to the VCSEL flip-chips 2 in order to drive the VCSELS of the flip-chips 2.

The bottom surface 3b of the substrate 3 has an array of lenses 11 formed therein (FIG. 1B). The lenses 11 are typically diffractive or refractive lenses. Each lens 11 is precisely aligned with a respective VCSEL of one of the VCSEL flip-chips 2. Each lens 11 directs a beam of light produced by a respective VCSEL toward an end of an optical fiber held in a ferrule of a multi-optical fiber ferrule device, as will be described below in more detail with reference to FIGS. 5A-6. As can be seen in FIG. 1B, each VCSEL flip-chip 2 has a group of the lenses 11 located beneath it. The VCSEL flip-chip assembly 1 has an array of N VCSELs, where N is an integer than is equal to or greater than two (i.e., the assembly 1 has at least two chips 2, each having at least one VCSELs). Likewise, the substrate has an array of N lenses 11, where each lens is associated with a respective one of the VCSELs.

As can be seen in FIGS. 1B and 1C, the bottom surface 3b of the substrate 3 has a plurality of balls 10 disposed thereon. The balls 10 are disposed at precise locations on the bottom surface 3b relative to one another and relative to the VCSEL flip-chips 2. As will be described below in more detail with reference to FIGS. 4-5b, the balls 10 are used as a mating feature for mating the flip-chip assembly 1 with a multi-optical fiber ferrule device that holds ends of a plurality of optical fibers (not shown). The mating of the flip-chip assembly 1 with the multi-optical fiber ferrule device brings the ends of the optical fibers into alignment with the respective VCSELs of the flip-chips, as will be described below in more detail.

Semiconductor fabrication processes are used to form the traces 4 and 7, the contact pads 8 and the vias 5 in the substrate 3. The substrate 3 may, for example, be glass, although the substrate 3 is not limited to any particular materials, provided the material is transparent to the operating wavelength of light of the VCSELs. As is well known in the art of semiconductor fabrication, very precise features can be formed at very precise locations on a substrate material using semiconductor fabrication processes such as, for example, photolithography. In accordance with an illustrative embodiment, such techniques are used to define the locations at which the balls 10 will be placed on the bottom surface 3a of the substrate. The locations for the balls 10 can be defined by, for example, forming a round pad for each ball location using photolithography. After the VCSEL flip-chips 2 have been flip-chip mounted on the upper surface 3a of the substrate 3, a material that is capable of being melted such as, for example, gold-tin (AuSn) alloy, in the form of a ball can be attached to each pad. Such solder ball attachment processes are well known to those skilled in the art, and therefore will not be further described herein in the interest of brevity.

The balls 10 may be made of a variety of materials that have characteristics that make them suitable for use as mating features. Examples of suitable materials are AuSn solder and epoxy. The shape and size of the balls 10 are chosen to provide an interference fit with openings with which the balls 10 mate, as will be described below in more detail with reference to FIGS. 5A and 5B. The balls 10 are depicted as being perfectly spherical in shape, but they are typically shaped as truncated spheres, where the portions of the balls 10 that are in contact with the bottom surface 3b are the truncated portions of the balls 10 and where the portions of the balls 10 that are not in contact with the bottom surface 3b are the spherical portions of the balls 10.

Figure 2:
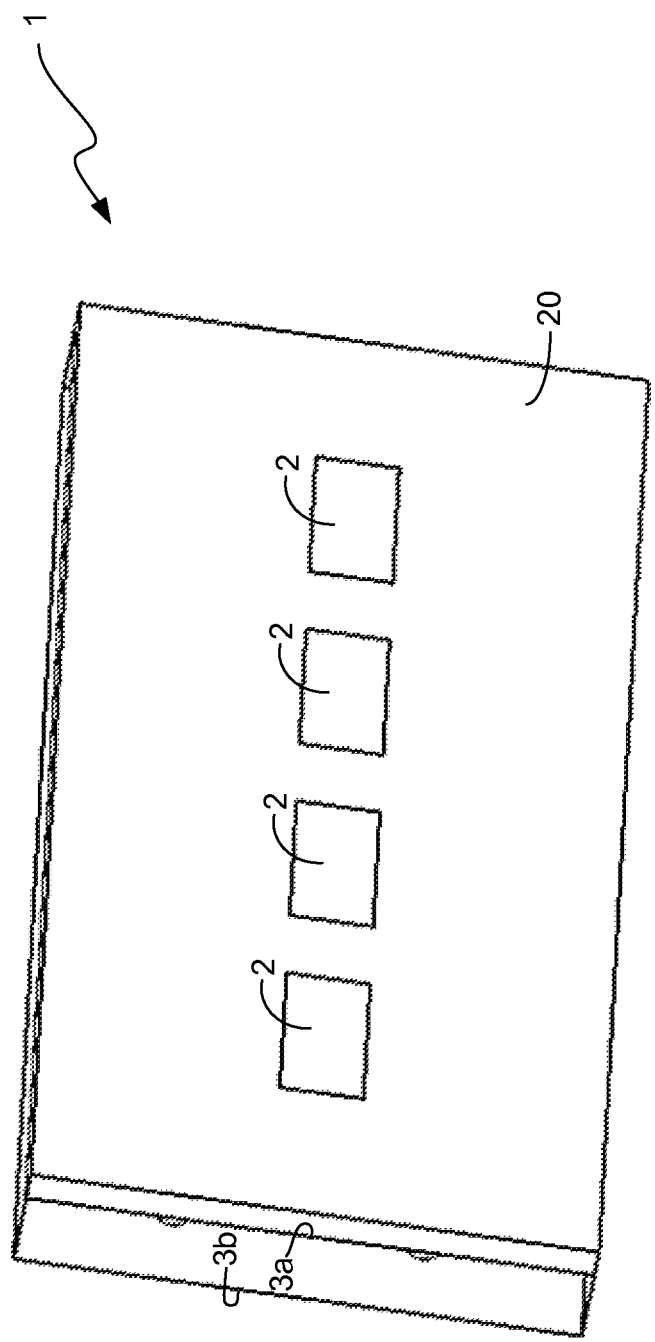
FIG. 2 illustrates a top perspective view of the VCSEL flip-chip assembly shown in FIGS. 1A-1C after the top surface of the assembly has been covered with an encapsulation material.
Figure 3:
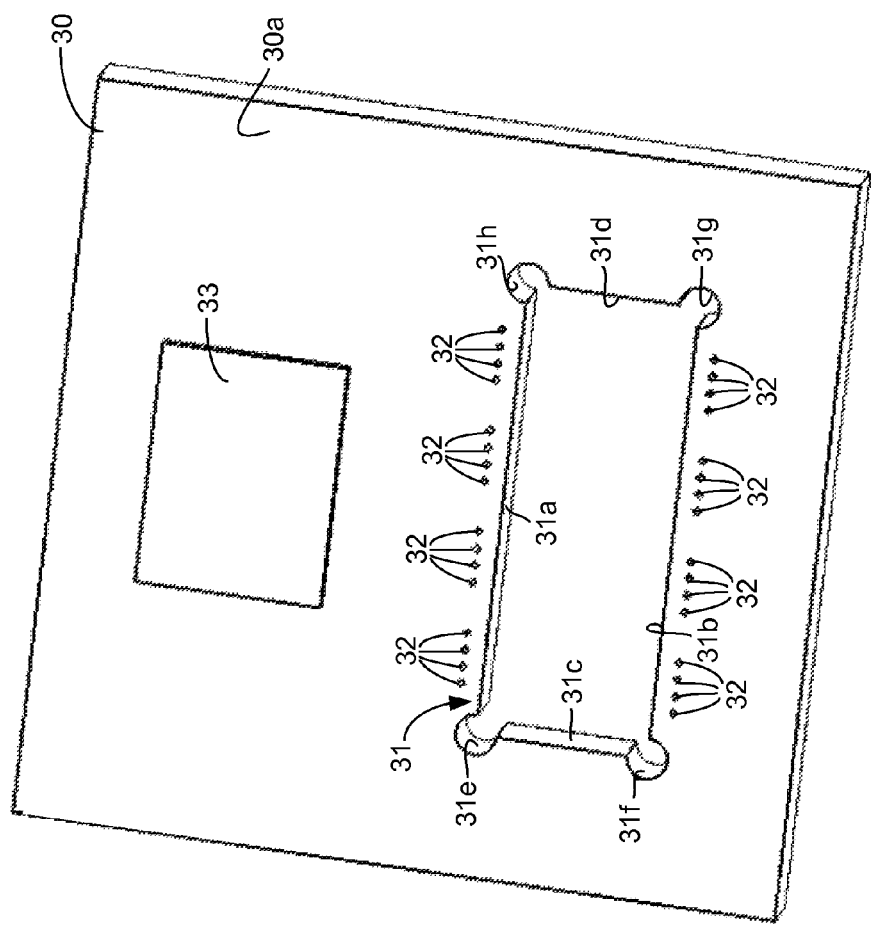
FIG. 3 illustrates a top perspective view of a PCB prior to the VCSEL flip-chip assembly shown in FIG. 2 being mounted thereon.

FIG. 2 illustrates a top perspective view of the VCSEL flip-chip assembly shown in FIGS. 1A-1C after the top surface of the assembly has been covered with an encapsulation material 20. The encapsulation material 20 extends between the outer peripheries of the VCSEL flip-chips 2 and the upper surface 3a of the substrate 3 of the assembly 1. The VCSEL flip-chips 2 are at least partially encapsulated in the encapsulation material 20, which comprises a sealing material such as epoxy, for example. The encapsulation material 20 forms seals that extend between the outer periphery of each flip-chip 2 and the top surface 3a of the substrate 3, as depicted in FIG. 3. The encapsulation material 20 seals gaps between the surfaces of the flip-chips 2 and the top surface 3a of the substrate, thereby preventing particulates and contaminants from impeding the optical pathways between the VCSELs of the flip-chips 2 and the respective lenses 11. In environments in which particulates or contaminants are not a concern, the encapsulation material 20 may not be needed.

Figure 4A:
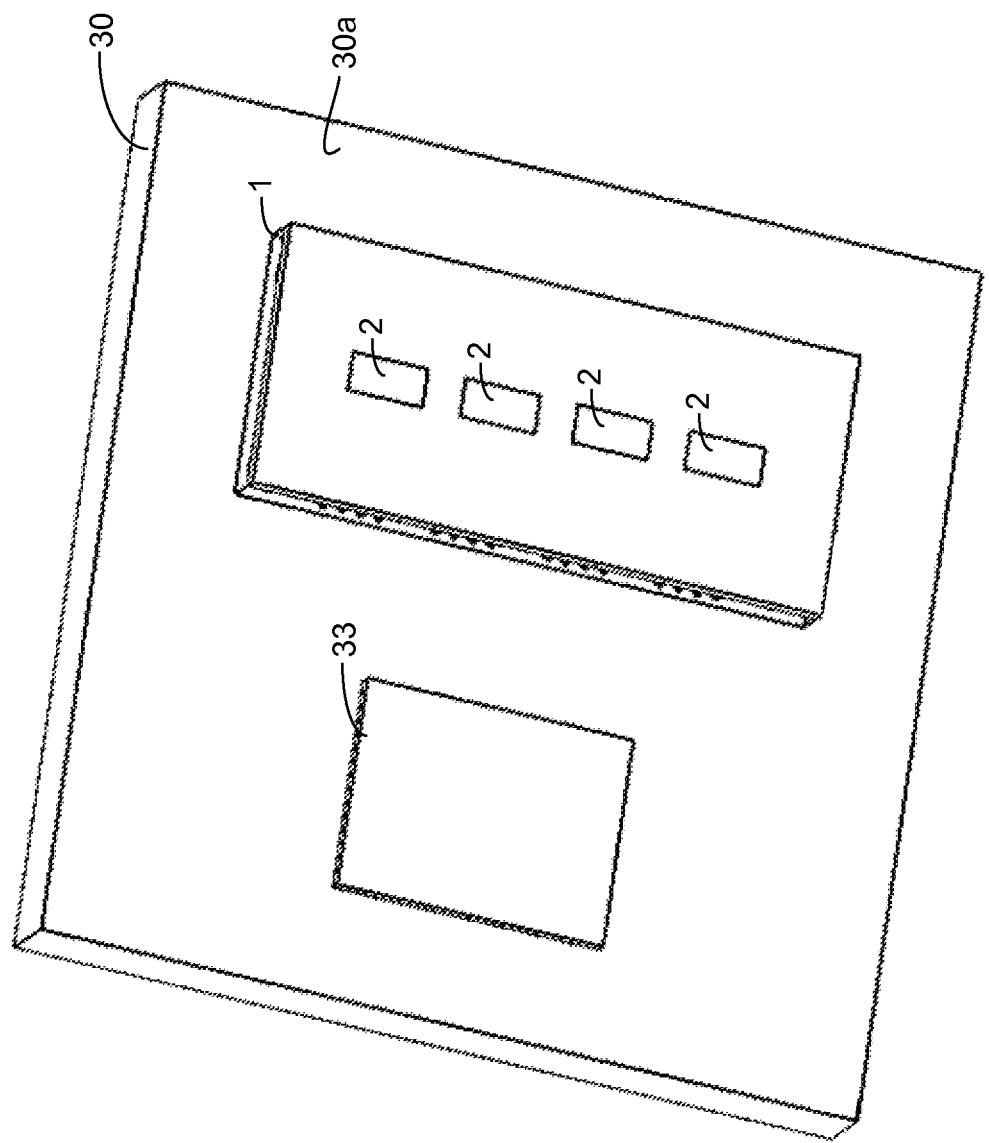
FIGS. 4A and 4B illustrate top and bottom perspective views, respectively, of the PCB shown in FIG. 3 with the VCSEL flip-chip assembly shown in FIG. 2 mounted thereon.
Figure 4B:
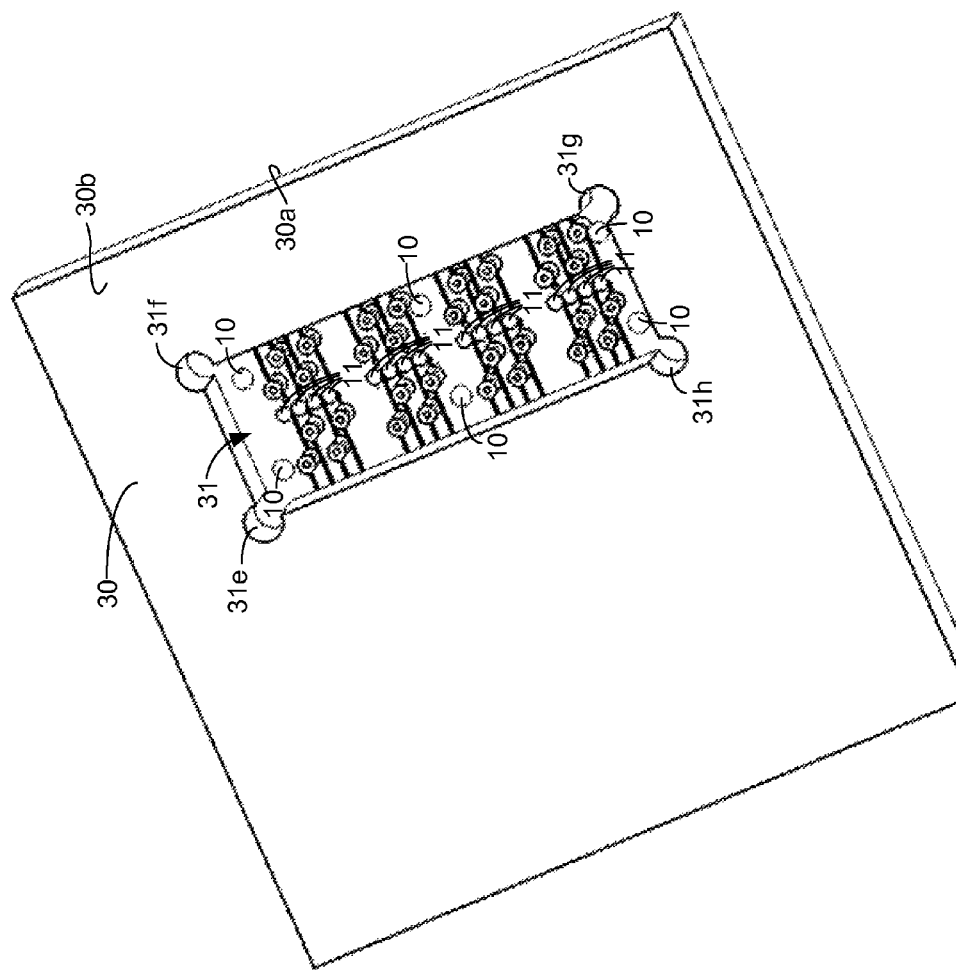
Figure 5A:
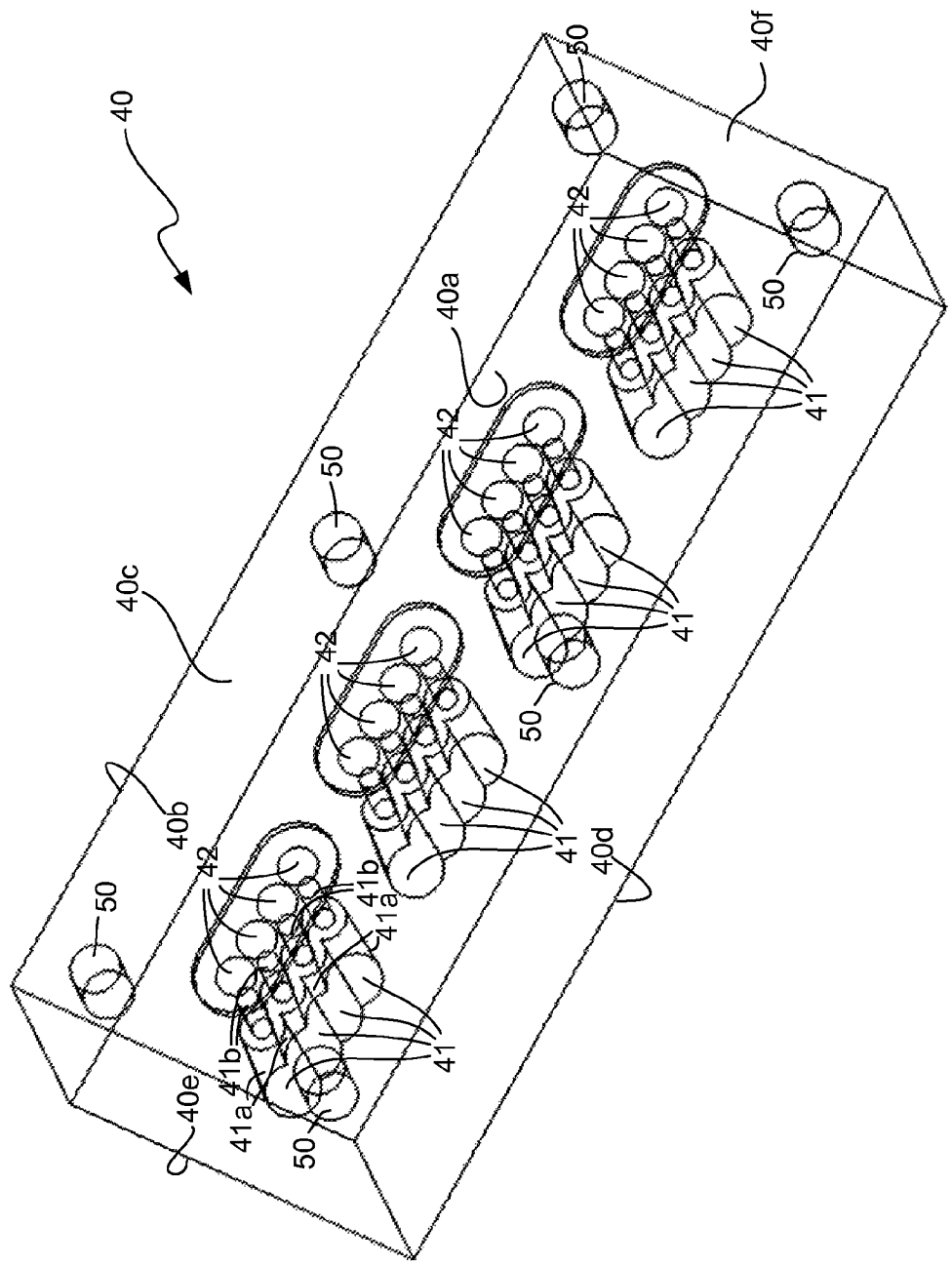
FIGS. 5A and 5B illustrate back and front perspective views, respectively, of an optical fiber ferrule device that mates with the VCSEL flip-chip assembly shown in FIGS. 1A-2 for aligning ends of optical fibers held in the ferrule device with VCSELs of the VCSEL flip-chip assembly.
Figure 5B:
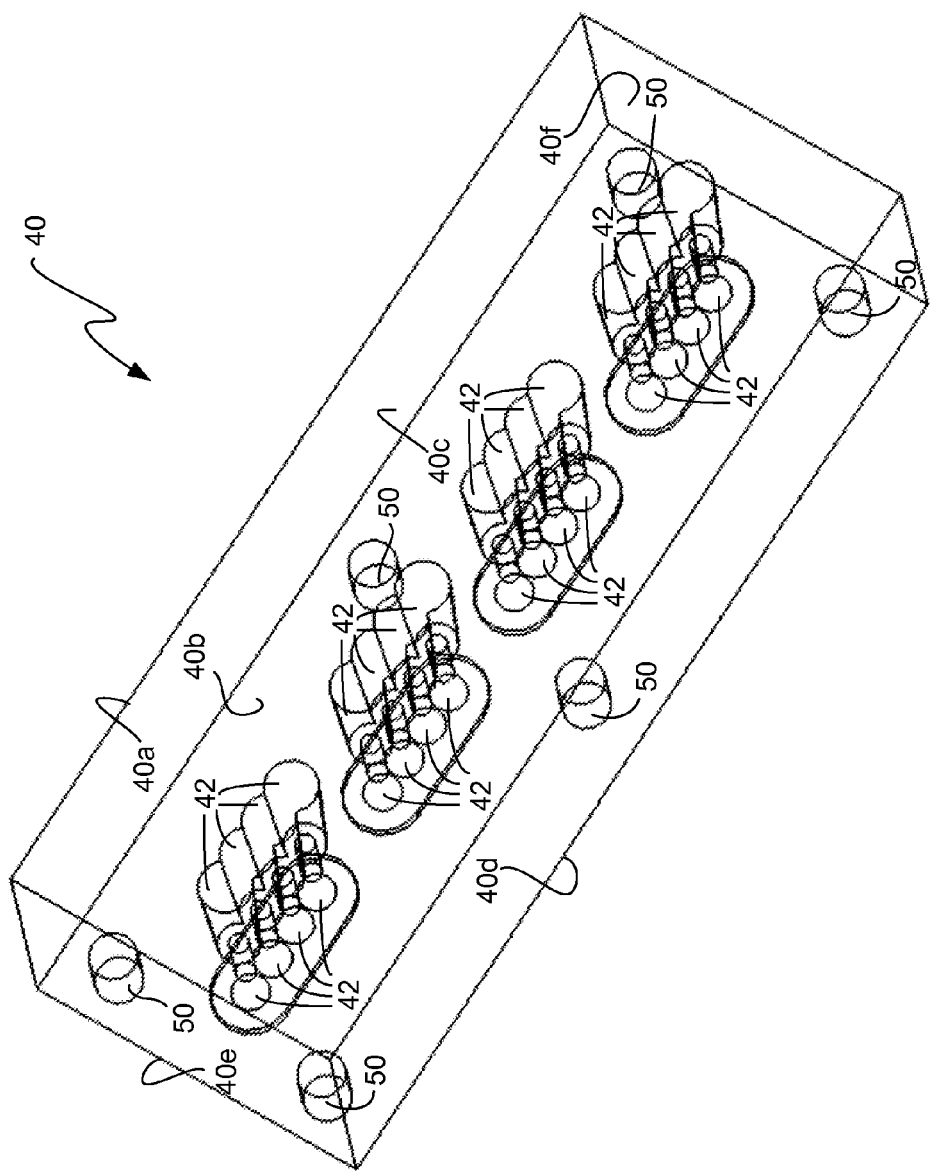

FIG. 3 illustrates a top perspective view of a PCB 30 prior to the VCSEL flip-chip assembly 1 shown in FIG. 2 being mounted thereon. FIGS. 4A and 4B illustrate top and bottom perspective views, respectively, of the PCB 30 shown in FIG. 3 with the VCSEL flip-chip assembly 1 mounted thereon. The PCB 30 has an opening 31 (FIG. 3) formed therein that extends through the PCB 30. FIGS. 5A and 5B illustrate back and front perspective views, respectively, of a multi-optical fiber ferrule device 40 that mates with the VCSEL flip-chip assembly 1 to align ends of optical fibers (not shown) held in the ferrule device 40 with VCSELs of the VCSEL flip-chips 2. The top surface 30a of the PCB 30 has electrical contact pads 32 thereon that come into contact with respective electrical contacts 8 disposed on the bottom surface 3b of the substrate 3 (FIG. 1B) when the VCSEL flip-chip assembly 1 is mounted on the PCB 30, as shown in FIG. 4A.

The opening 31 has a width that is defined by upper and lower sides 31a and 31b, respectively, and a length that is defined by left and right sides 31c and 31d, respectively. The shape and size of the opening 31 defined by the sides 31a-31d is complementary to the shape and size of the ferrule device 40 (FIGS. 5A and 5B) that mates with the VCSEL flip-chip assembly 1. In other words the opening 31 has a length and a width that is about the same, but slightly greater than, the length and width of the ferrule device 40 such that when the ferrule device 40 is inserted into the opening 31, there is very little space between the sides 31a-31d and the respective sides of the ferrule device 40. The opening 31 has rounded corners 31e-31h to ease the insertion of the ferrule device 40 into the opening 31. The rounded corners 31e-31h allow an adhesive material such as epoxy (not shown) to be dispensed therein in order to bond the assembly 1 to the PCB 30.

In accordance with an illustrative embodiment, a controller IC 33 is mounted on the top surface 30a of the PCB 30, as shown in FIGS. 3 and 4A. The controller IC may be, for example, a laser diode driver IC for driving the VCSELs of the VCSEL flip-chips 2 (FIG. 1A), in which case electrical drive signals (e.g., modulation and bias current signals) outputted from the IC 33 are transferred over electrically-conductive traces (not shown) of the PCB 30 to the contact pads 32 disposed on the top surface 30a of the PCB 30. The electrical drive signals are then conducted by the contact pads 8, traces 7, and vias 5 to the contact pads of the VCSEL flip-chips 2.

As shown in FIG. 4B, when the assembly 1 is mounted on the PCB 30, the bottom surface 3b of the substrate 3 is positioned immediately above the opening 31 formed in the PCB 30, and the sides of the flip-chips 2 on which the VCSEL apertures (not shown) are disposed face the opening 31. The corners of the assembly 1 are above the rounded corners 31e-31h of the opening 31, and are therefore in contact with the adhesive material (not shown) that is disposed within the rounded corners 31e-31h of the opening 31. The adhesive material may also be dispensed on the top surface 30a of the PCB 30 at locations where the assembly 1 comes into contact with the top surface 30a of the PCB 30. The adhesive material bonds the assembly 1 to the top surface 30a of the PCB 30, although other or additional mechanisms or devices may be used to secure the assembly 1 to the PCB 30.

FIGS. 5A and 5B illustrate back and front perspective views, respectively, of a multi-optical fiber ferrule device 40 that mates with the VCSEL flip-chip assembly 1 to align ends of optical fibers (not shown) held in the ferrule device 40 with VCSELs of the VCSEL flip-chips 2. The ferrule device 40 has a back side 40a, a front side 40b, a top side 40c, a bottom side 40d, a left side 40e, and a right side 40f. The back side 40a has openings 41 formed therein that extend a distance into the ferrule device 40 in a direction toward the front side 40b and normal to at least the back side 40a. In accordance with this illustrative embodiment, the ferrule device 40 is rectangular in shape such that the back side 40a and front side 40b are parallel to one another, the top side 40c and the bottom side 40d are parallel to one another and perpendicular to the back side 40a and front side 40b, and the left and right sides 40e and 40f are parallel to one another and perpendicular to the back side 40a, the front side 40b, the top side 40c, and the bottom side 40d. However, the ferrule device 40 does not necessarily have this shape, but could have a variety of shapes, as will be understood by persons of skill in the art in view of the description being provided herein.

The openings 41 are ferrules that are shaped and sized to receive respective optical fiber cables (not shown) and have back portions 41a that are complementary in shape to the shape of the fiber cables and front portions 41b that are complementary in shape to the fibers of the fiber cables. When the fiber cables are held within the respective ferrules 41, ends of the respective optical fibers are disposed in the respective front portions 41b of the ferrules 41. In accordance with this illustrative embodiment, the front side 40b of the ferrule device 40 has N lenses 42 formed therein, where N is the number of VCSELs in the VCSEL array of the VCSEL flip-chip assembly 1 (FIG. 1A). The lenses 42 are transparent to the operating wavelength of light produced by the VCSELs, and in some case the entire ferrule device 40 may be transparent to the operating wavelength of light produced by the VCSELs.

The front side 40b of the ferrule device 40 has openings 50 formed therein that are shaped and sized to mate with the balls 10 (FIG. 4B) disposed on the bottom surface 3b of the substrate 3 of the assembly 1. After the assembly 1 has been secured to the PCB 30, as shown in FIG. 4B, the ferrule device 40 is inserted into the opening 31 formed in the PCB 30 with the front side 40b of the ferrule device 40 facing toward the bottom surface 3b of the substrate 3 of the assembly 1. As the front side 40b of the ferrule device 40 passes into the opening 31, the balls 10 begin to mate with the respective openings 50 formed in the front side 40b of the ferrule device 40. When the balls 10 are fully mated with the openings 50, the lenses 42 of the ferrule device 40 are in abutment with, or at least in proximity to, the respective lenses 11 formed in the bottom surface 3b of the substrate 3. The mating of the balls 10 with the openings 50 precisely aligns the assembly 1 with the ferrule device 40, which brings the VCSELs into precise alignment with the ends of the optical fibers held in the front portions 41b of the ferrules 41. The lenses 11 and 42 together cause the light produced by the respective VCSELs to be focused onto the ends of the respective optical fibers held in the front portions 41b of the respective ferrules 41. It should be noted that both sets of lenses 11 and 42 are not needed in all cases. Because of the precise alignment between the VCSELS and the ends of the optical fibers, and because of the proximity of the VCSELs to the respective ends of the optical fibers, it is possible that only the lenses 11 or the lenses 42, but not both, are needed.

The ferrule device 40 is typically made of a molded plastic material. One of the advantages of making the ferrule device 40 out of molded plastic is that plastic molding processes allow features to made with very high precision. Therefore, it can be ensured that the locations, sizes and shapes of the openings 50 are very precise, which ensures that the mating of the openings 50 with the balls 10 will bring the ends of the fibers that are disposed within the front portions 41b of the ferrules 41 into precise alignment with the lenses 11 and 42. It should be noted, however, that the ferrule device 40 may be made of any suitable material, including, but not limited to, a variety of plastic and metal materials.

One of the advantages of the VCSEL flip-chip assembly 1 is that it can be handled as an SMT component. In other words, during the process of mounting the IC 33 (FIGS. 3 and 4A) and the assembly 1 on the PCB 30, a machine vision system and pick-and-place tool of the type that are normally used to mount SMT components on a PCB may be used to mount the IC 33, the assembly 1 and any other SMT components on the PCB 30. Also, the assembly 1 can be constructed at the wafer level and then singulated into the individual assemblies 1. Thus, the assemblies 1 can be cost-effectively mass produced with very tight tolerances to produce precisely aligned VCSEL arrays. Once the assemblies 1 have been mounted on the respective PCBs 30, the respective ferrule devices 40 can be easily mated with the assemblies 1 in the manner described above to bring the VCSELs of the arrays into precise alignment with ends of the fibers held within the front portions 41b of the ferrules 41. After the ferrule devices 40 have been mated with the respective assemblies 1, suitable securing mechanisms (not shown for ease of illustration and clarity) are typically used to fixedly secure the ferrule devices 40 to the respective PCBs 30.

It should be noted that the mating features 10 and 50 may have any desired shapes or configurations provided that the mating features 10 and 50 precisely mate with one another.

For example, while the mating features 10 have been described as being balls, they could be rectangles or some other shape. Also, the balls 10 could be disposed on the ferrule device 40 and the openings 50 could be formed in the substrate 3.

Figure 6:
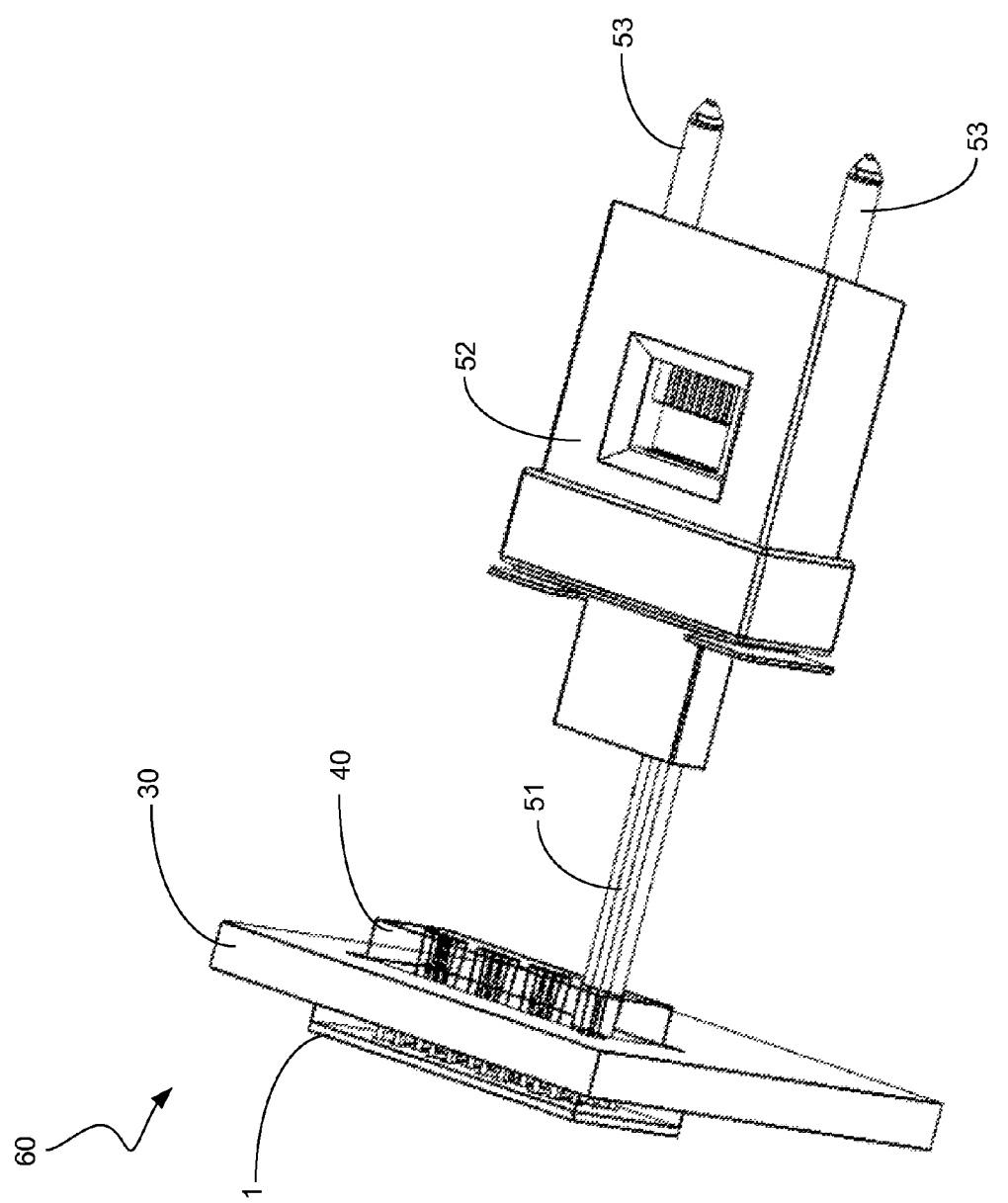
FIG. 6 illustrates a top perspective view of the PCB shown in FIGS. 3A and 3B with the optical fiber ferrule device shown in FIGS. 5A and 5B secured thereto, with first ends of a plurality of optical fibers held in the ferrule device, and with an MT connector secured to second ends of the optical fibers.

FIG. 6 illustrates a top perspective view of a parallel optical transmitter module 60 comprising the PCB 30 shown in FIGS. 3A and 3B, the VCSEL flip-chip assembly 1 and the multi-optical fiber ferrule device 40. First ends of a first plurality of optical fibers 51 are held in the ferrule device 40, as described above, and an MT connector 52 is secured to second ends of the optical fibers 51. As an example of one possible implementation scenario, the PCB 30 having the assembly 1 and the ferrule device 40 secured thereto may be disposed inside of box (not shown), such as an electromagnetic interference (EMI) cage housing, and the MT connector 52 may be positioned in a front panel of a rack (not shown) that contains the EMI cage housing. The MT connector 52 is a known male version of a connector that has alignment pins 53 for mating with respective alignment holes formed in a known female MT connector (not shown). In this exemplary scenario, the female MT connector would be plugged into the male MT connector 52 on the front panel of the rack. The female MT connector would be connected to ends of a second plurality of optical fibers (not shown) of an optical communications network (not shown) for communicating the optical signals produced by the VCSELs of the assembly 1 over the network.

Figure 7:
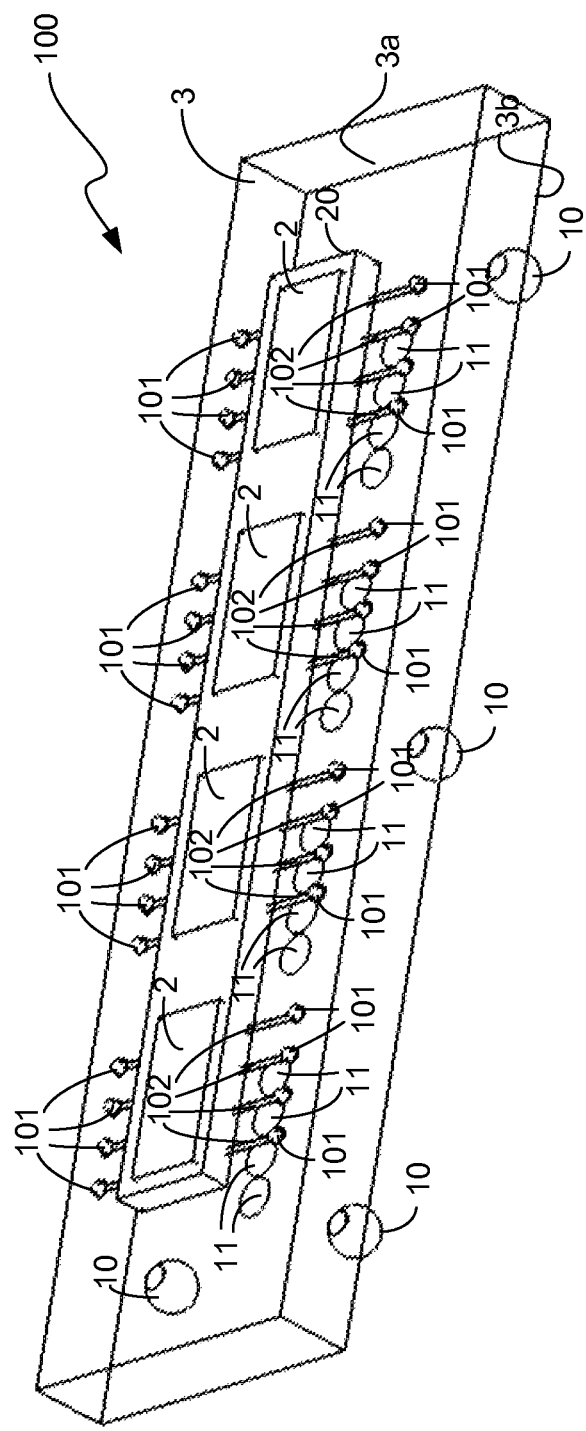
FIG. 7 illustrates a top perspective view of the VCSEL flip-chip assembly in accordance with another illustrative embodiment.
Figure 8:
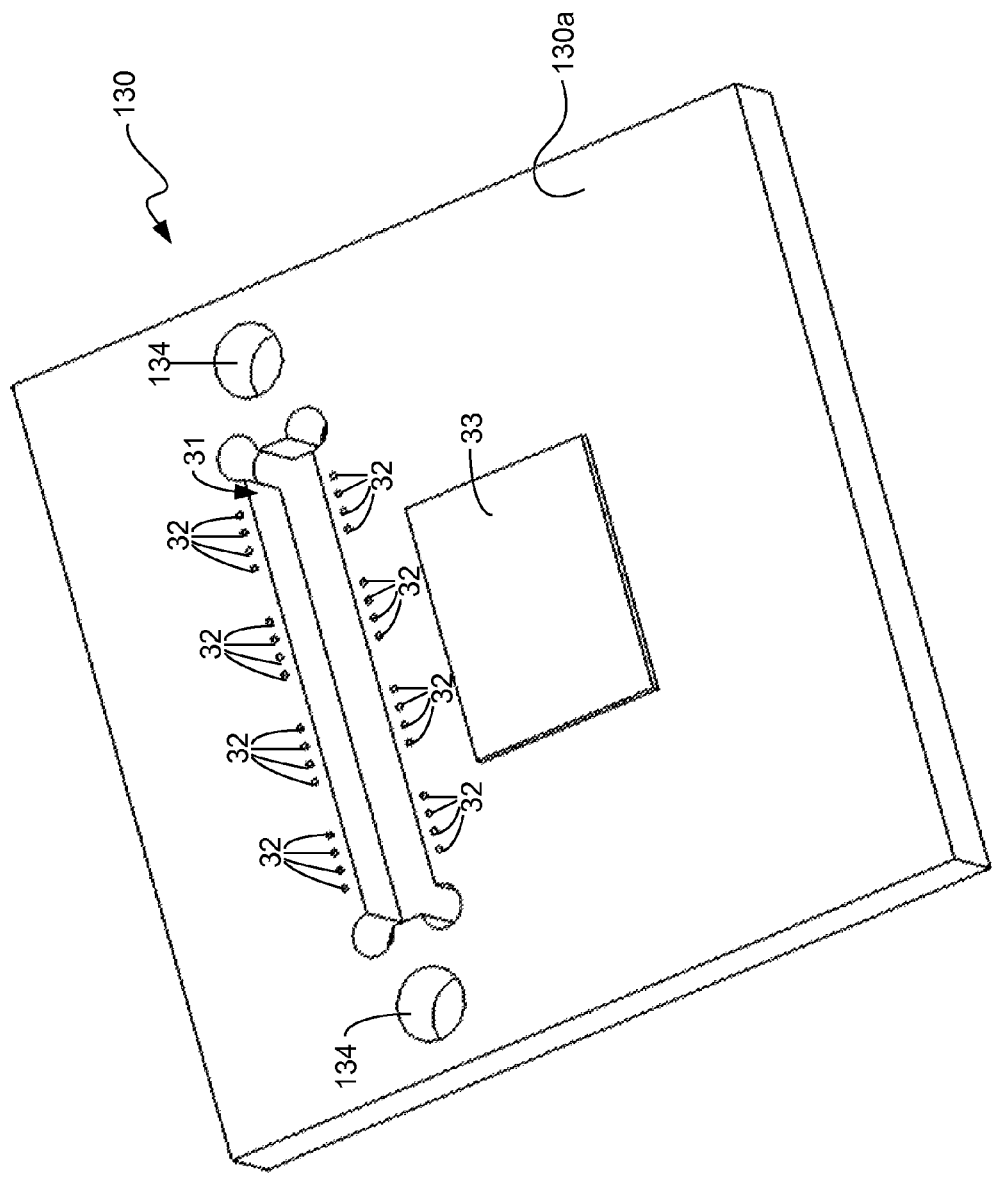
FIG. 8 illustrates a top perspective view of a PCB on which the VCSEL flip-chip assembly shown in FIG. 7 may be mounted.
Figure 9:
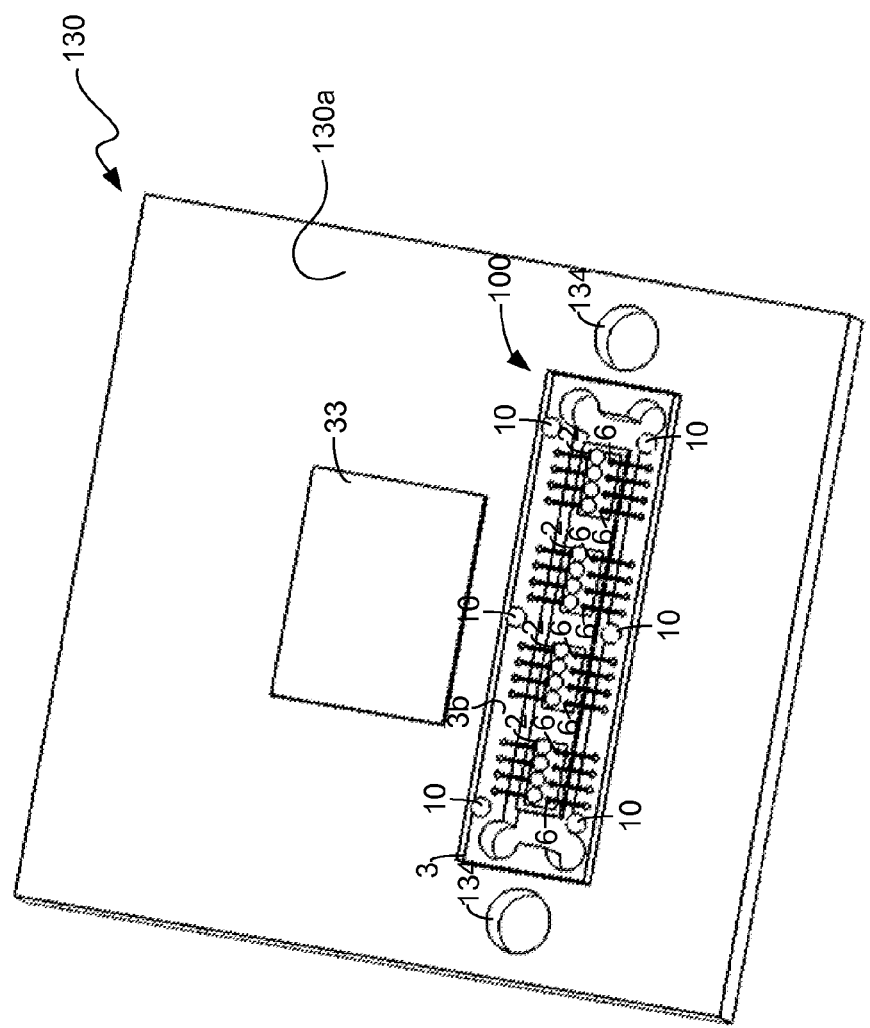
FIG. 9 illustrates a top perspective view of the PCB shown in FIG. 8 with the VCSEL flip-chip assembly shown in FIG. 7 mounted thereon.
Figure 10:
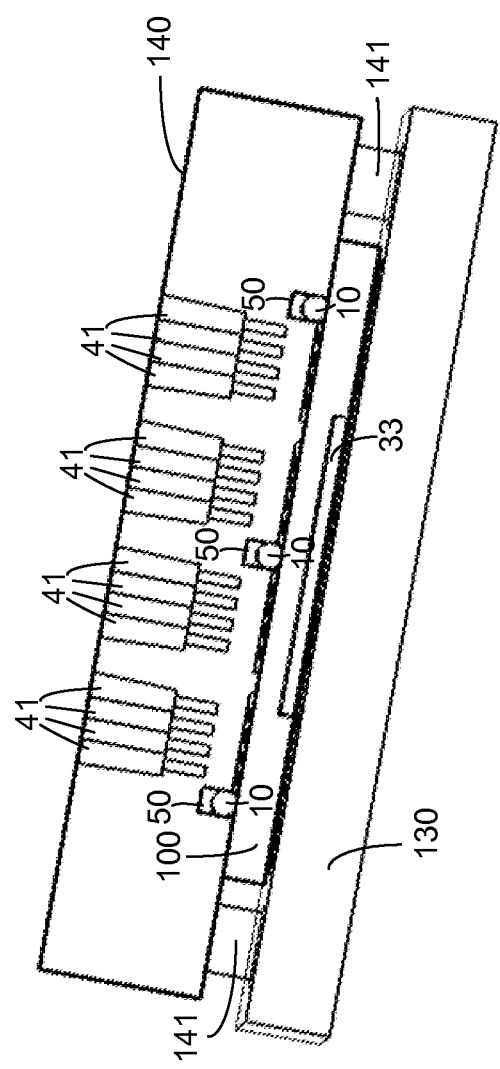
FIG. 10 illustrates a side perspective view of the PCB with the VCSEL flip-chip assembly mounted thereon, as shown in FIG. 9, with a multi-optical fiber ferrule device secured thereto.
Figure 11:
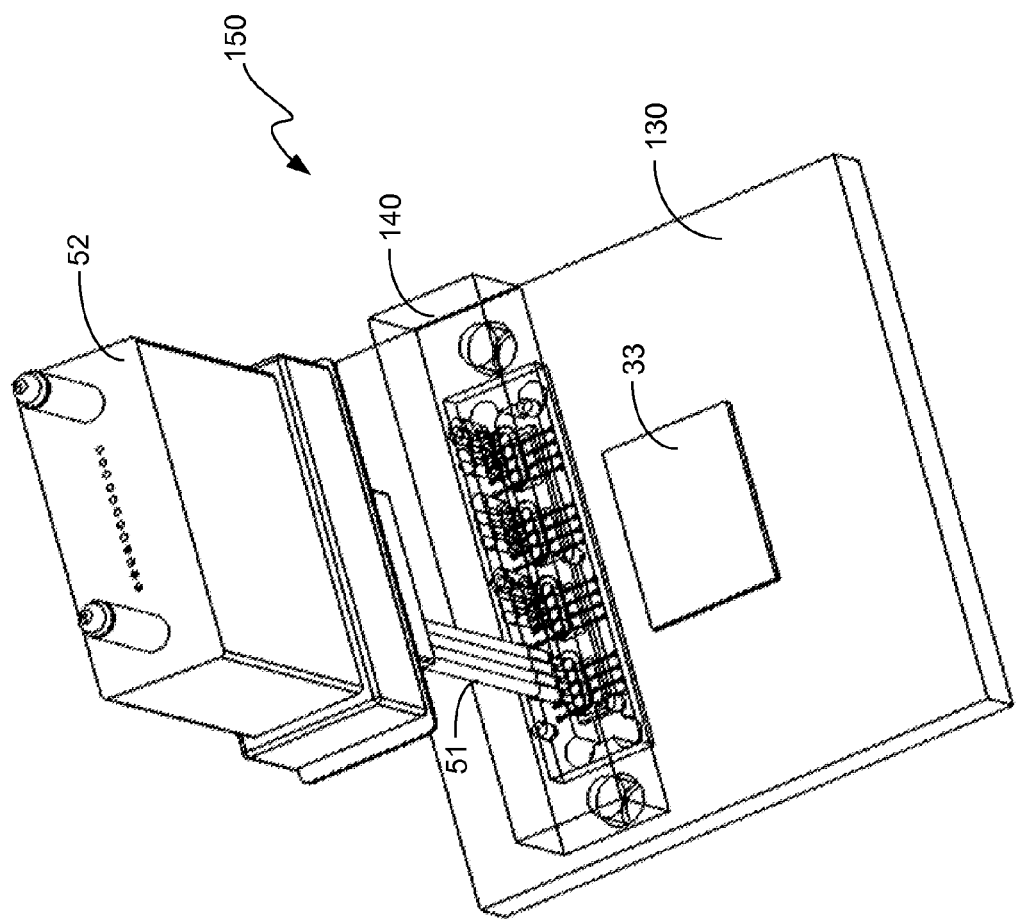
FIG. 11 illustrates a top perspective view of a parallel optical transmitter assembly comprising a connector connected to optical fibers that are connected to the ferrule device shown in FIG. 10, which is secured to the PCB in alignment with the VCSEL flip-chip assembly shown in FIG. 10.

FIG. 7 illustrates a top perspective view of the VCSEL flip-chip assembly 100 in accordance with another illustrative embodiment. FIG. 8 illustrates a top perspective view of a PCB 130 on which the VCSEL flip-chip assembly 100 shown in FIG. 7 may be mounted. FIG. 9 illustrates a top perspective view of the PCB 130 shown in FIG. 8 with the VCSEL flip-chip assembly 100 shown in FIG. 7 mounted thereon. FIG. 10 illustrates a side perspective view of the PCB 130 shown in FIG. 9 with the VCSEL flip-chip assembly 100 mounted thereon and with a multi-optical fiber ferrule device 140 secured thereto. FIG. 11 illustrates a top perspective view of a parallel optical transmitter module 150 comprising a connector 52 connected to optical fibers 51 that are connected to the ferrule device 140 shown in FIG. 10, which is secured to the PCB 130 in alignment with the VCSEL flip-chip assembly 100.

The VCSEL flip-chip assembly 100 shown in FIG. 7 is identical to the VCSEL flip-chip assembly 1 shown in FIGS. 1A-1C except that the assembly 100 does not have the electrical contacts 8 and electrical traces 7 disposed on the bottom surface 3b of the substrate 3 and does not have the vias 5 formed in the substrate 3. Because many features of the VCSEL flip-chip assembly 100 are identical to features of the VCSEL flip-chip assembly 1 shown in FIGS. 1A-2, like reference numerals in FIGS. 1A-2 and 7 are used to represent like features. Likewise, the PCB 130 shown in FIG. 8 is identical to the PCB 30 shown in FIG. 3 except that the PCB 130 has holes 134 formed therein on opposite sides of the opening 31 for securing the ferrule device 140 to the PCB 130, as will be described below in more detail with reference to FIG. 10. Because many features of the PCB 130 are identical to features of the PCB 30, like reference numerals in FIGS. 3 and 8 are used to represent like features. Likewise, the ferrule device 140 shown in FIG. 10 is identical to the ferrule device 40 shown in FIGS. 5A and 5B except that the ferrule device 140 has posts 141 disposed at opposite ends thereof for mating with the holes 134 formed in the PCB 130. Because many features of the ferrule device 140 are identical to features of the ferrule device 40, like reference numerals in FIGS. 5, 5B and 10 are used to represent like features.

Electrical contact pads 101 and electrical traces 102 (FIG. 7) are disposed on the top surface 3a of the substrate 3 of the assembly 100. First ends of the electrical traces 102 are connected to the contact pads 101 of the PCB 130 and second ends of the traces 102 are connected to the contact pads 6 (FIG. 9) of the VCSEL flip-chips 2 (FIG. 7). When the assembly 100 is mounted on the PCB 130 as shown in FIG. 9, the electrical contact pads 101 disposed on the top surface 3a of the assembly 100 are in contact with the electrical contact pads 32 (FIG. 8) disposed on the top surface 130a of the PCB 130 via the traces 102. The ferrule device 140 (FIG. 10) has posts 141 thereon that mate with the holes 134 formed in the PCB 130 to roughly align the ferrule device 140 with the assembly 100. The balls 10 (FIGS. 7 and 9) disposed on the bottom surface 3b of the assembly 100 then mate with the openings 50 (FIG. 10) formed in the ferrule device 140 to finely align the ferrule device 140 with the assembly 100. After fine alignment has been achieved, the holes 134 and the posts 141 are fixedly secured to one another by an adhesive material such epoxy.

It can be seen in the embodiment of FIG. 10 that the assembly 100 is positioned in between the PCB 130 and the ferrule device 140, whereas in the embodiment of FIG. 6, the PCB 30 is positioned in between the assembly 1 and the ferrule device 40. As shown in FIG. 11, the connector 52 and fibers 51 shown in FIG. 6 may be connected to the ferrule device 140 in the same manner depicted in FIG. 6. The same result is achieved in both embodiments, but the mounting configurations are different and the configurations for electrically interconnecting the assemblies 1 and 100 to the PCBs 30 and 130, respectively, are different.

It should be noted that the VCSEL flip-chip assemblies 1 and 100 have been described with reference to their uses in forming arrays of VCSELs that can be used in optical transmitters. The flip-chip assemblies could instead be made up of flip-chips that have photosensors instead of, or in addition to, VCSELs. For example, each of the VCSELs of the flip-chips 2 could be replaced by photosensors, such as P-intrinsic-N (PIN) photosensors, or one or more of the optoelectronic elements of each flip-chip 2 may be photosensors and the other optoelectronic elements of each flip-chip 2 may be VCSELs. In such cases, the optical transmitters 60 and 150 would instead be optical receivers or transceivers. Persons of skill in the art will understand the manner in which such flip-chips having such optoelectronic elements may be manufactured and incorporated into the assemblies 1 and 100. The term "optical communications module," as that term is used herein, denotes an optical transmitter module, an optical receiver module and an optical transceiver module.

It should be noted that the assemblies 1 and 100, the ferrule devices 40 and 140 and the optical communication modules 60 and 150 have been described with reference to a few illustrative embodiments for the purposes of demonstrating the principles and concepts of the invention and to provide a few examples of the manner in which the invention may be implemented. The invention is not limited to these embodiments, as will be understood by persons skilled in the art in view of the description provided herein. The assemblies 1 and 100, the ferrule devices 40 and 140 and the optical communications modules 60 and 150 may have a variety of configurations that are different from the illustrative embodiments described herein, as will be understood by persons of skill in the art.

What is claimed is:

1. A flip-chip assembly comprising:
a substrate that is transparent to a particular wavelength of light, the substrate having a top surface and a bottom surface, the bottom surface having a plurality of mating features disposed thereon at precise locations on the bottom surface of the substrate, each mating feature being sized and shaped to mate with a respective mating feature of a multi-optical fiber ferrule device;
a first set of electrically-conductive contact pads disposed on the top surface of the substrate;
a second set of electrically-conductive contact pads disposed on the bottom surface of the substrate;
a first set of electrically-conductive traces disposed on the top surface of the substrate, the traces having first and second ends, the first ends of the traces being connected to respective contact pads of the first set of electrically-conductive contact pads;
a second set of electrically-conductive traces disposed on the bottom surface of the substrate, the traces having first and second ends, the first ends of the traces being connected to respective contact pads of the second set of electrically-conductive contact pads;
a plurality of electrically-conductive vias extending between the top and bottom surfaces of the substrate, each via having a top end that is disposed adjacent the top surface of the substrate and having a bottom end that is disposed adjacent the bottom surface of the substrate, the bottom ends of the vias being connected to second ends of respective traces of the second set of traces, the top ends of the vias being connected to second ends of respective traces of the first set of traces; and
a plurality of flip-chips, each flip-chip having a plurality of optoelectronic elements formed therein, each flip-chip being flip-chip-mounted in a respective flip-chip mounting area of the top surface of the substrate, each flip-chip including a plurality of electrically-conductive contact pads, wherein the contact pads of the flip-chips are connected to second ends of respective traces of the first set of traces, and wherein the mating of the mating features disposed on the bottom surface of the substrate with the respective mating features of the ferrule device precisely aligns the optoelectronic elements of the flip-chips with ends of respective ferrules of the ferrule device.

2. The flip-chip assembly of claim 1, wherein the first set of contact pads are disposed on the top surface of the substrate and wherein the first set of traces are disposed on the top surface of the substrate.

3. The flip-chip assembly of claim 2, further comprising:
a circuit board having a top surface and a bottom surface, the circuit board having an opening formed in it, and wherein the top surface of the substrate of the assembly is in contact with the top surface of the circuit board and the contact pads of the first set of contact pads disposed on the top surface of the substrate are in contact with respective electrically-conductive contact pads disposed on the top surface of the circuit board, the flip-chips being disposed within the opening.

4. The VCSEL flip-chip assembly of claim 3, further comprising:
a multi-optical fiber ferrule device having a front side and a back side and N ferrules formed therein, the front side having said mating features thereon at particular locations that are shaped and sized to mate with the respective mating features disposed on the bottom surface of the substrate, the front side of the ferrule device being in contact with the bottom surface of the substrate and the mating features disposed on the front side of the ferrule device being fully mated with the respective mating features disposed on the bottom surface of the substrate, and wherein the full mating of the respective mating features brings the ferrules of the ferrule device into precise alignment with respective optoelectronic elements of the flip-chips.

5. The flip-chip assembly of claim 4, wherein the ferrule device is made of a material that is transparent to the particular wavelength of light.

6. The flip-chip assembly of claim 5, wherein the material is molded plastic.

7. The flip-chip assembly of claim 1, wherein each flip-chip is Vertical Cavity Surface Emitting Laser Diode (VCSEL) flip-chip and wherein the optoelectronic elements are VCSELs, each VCSEL flip-chip having at least N VCSELs that produce the particular wavelength of light and N apertures through which the light passes out of the VCSEL flip-chips, where N is an integer that is equal to or greater than one, and wherein the N apertures are formed in a top surface of the respective VCSEL flip-chips, the top surfaces of the VCSEL flip-chips being in contact with the top surface of the substrate such that most if not all of the light passing out of the VCSEL flip-chips through the apertures enters the substrate through the top surface of the substrate and exits the substrate through the bottom surface of the substrate.

8. The flip-chip assembly of claim 7, wherein the bottom surface of the substrate has N lenses formed therein, each lens being aligned with a respective VCSEL of a respective VCSEL flip-chip.

9. The flip-chip assembly of claim 8, wherein N is equal to or greater than two.

10. The flip-chip assembly of claim 7, further comprising:
a circuit board having a top surface and a bottom surface, the circuit board having an opening formed through it, and wherein the bottom surface of the substrate of the assembly is adjacent the top surface of the circuit board and the contact pads of the second set of contact pads disposed on the bottom surface of the substrate are in contact with respective electrically-conductive contact pads disposed on the top surface of the circuit board, the VCSEL flip-chips being disposed above the opening, wherein light produce by the VCSELs passes through the opening formed through the circuit board.

11. The flip-chip assembly of claim 10, further comprising:
a multi-optical fiber ferrule device having a front side and a back side and N ferrules formed therein, the front side having said mating features thereon at particular locations that are shaped and sized to mate with the respective mating features disposed on the bottom surface of the substrate, the front side of the ferrule device being disposed within the opening of the circuit board and the mating features disposed on the front side of the ferrule device being fully mated with the respective mating features disposed on the bottom surface of the substrate, and wherein the full mating of the respective mating features brings the ferrules of the ferrule device into precise alignment with respective VCSELs of the flip-chips.

12. The flip-chip assembly of claim 11, wherein the ferrule device is made of a material that is transparent to the particular wavelength of light.

13. The flip-chip assembly of claim 12, wherein the material is molded plastic.

14. The flip-chip assembly of claim 1, further comprising:
an encapsulation material disposed on the top surface of the substrate and extending at least between outer peripheries of the flip-chips and the top surface of the substrate, the encapsulation material comprising an electrically-nonconductive material, wherein the encapsulation material prevents ingression of contaminants into respective optical pathways between the respective apertures of the respective optoelectronic elements and the top surface of the substrate.

15. The flip-chip assembly of claim 14, wherein the electrically noncondutive material is epoxy.

16. The flip-chip assembly of claim 1, wherein the mating features disposed on the bottom surface of the substrate are balls and wherein the mating features of the ferrule device are openings shaped and sized to mate with the balls in a tight, or interference, fit.

17. The flip-chip assembly of claim 16, wherein the balls are solder balls.

18. The flip-chip assembly of claim 17, wherein the solder balls are made of a gold-tin alloy.

19. The flip-chip assembly of claim 16, wherein the balls are epoxy balls.

20. An optical communications module comprising:
a substrate that is transparent to a particular wavelength of light, the substrate having a top surface and a bottom surface, the bottom surface having a plurality of mating features disposed thereon at precise locations on the bottom surface of the substrate, each mating feature being sized and shaped to mate with a respective mating feature of a multi-optical fiber ferrule device;
at least a first set of electrically-conductive contact pads disposed on the substrate;
a first set of electrically-conductive traces disposed on the substrate, the traces having first and second ends, the first ends of a first set of traces being connected to respective contact pads of the first set of electrically-conductive contact pads, wherein the first set of traces is disposed on the top surface of the substrate;
a second set of electrically-conductive contact pads disposed on the bottom surface of the substrate, the contact pads of the second set of contact pads being connected to first ends of a second set of traces disposed on the bottom surface of the substrate;
a plurality of electrically-conductive vias extending between the top and bottom surfaces of the substrate, each via having a top end that is disposed adjacent the top surface of the substrate and having a bottom end that is disposed adjacent the bottom surface of the substrate, the bottom ends of the vias being connected to second ends of respective traces of the second set of traces, the top ends of the vias being connected to first ends of respective traces of the first set of traces;
a plurality of flip-chips, each flip-chip having a plurality of optoelectronic elements formed therein, each flip-chip being flip-chip-mounted in a respective flip-chip mounting area of the top surface of the substrate, each flip-chip including a plurality of electrically-conductive contact pads, wherein the contact pads of the flip-chips are connected to second ends of respective traces of the first set of traces, and wherein the mating of the mating features disposed on the bottom surface of the substrate with the respective mating features of the ferrule device precisely aligns the optoelectronic elements of the flip-chips with ends of respective ferrules of the ferrule device;
a circuit board having a top surface and a bottom surface, wherein the substrate is mounted on the circuit board such that the mating features disposed on the bottom surface of the substrate are exposed to mate with the mating features of the ferrule device; and
a multi-optical fiber ferrule device having a front side and a back side and N ferrules formed therein, the front side having said mating features thereon at particular locations that are shaped and sized to mate with the respective mating features disposed on the bottom surface of the substrate, the mating features of the ferrule device being fully mated with the respective mating features of the substrate, and wherein the full mating of the respective mating features brings the ferrules of the ferrule device into precise alignment with respective optoelectronic elements of the flip-chips.

21. The optical communications module of claim 20, wherein the first set of contact pads are disposed on the top surface of the substrate and wherein the first set of traces are disposed on the top surface of the substrate.

22. The optical communications module of claim 20, wherein each flip-chip is Vertical Cavity Surface Emitting Laser Diode (VCSEL) flip-chip and wherein the optoelectronic elements are VCSELs, each VCSEL flip-chip having at least N VCSELs that produce the particular wavelength of light and N apertures through which the light passes out of the VCSEL flip-chips, where N is an integer that is equal to or greater than one, and wherein the N apertures are formed in a top surface of the respective VCSEL flip-chips, the top surfaces of the VCSEL flip-chips being in contact with the top surface of the substrate such that most if not all of the light passing out of the VCSEL flip-chips through the apertures enters the substrate through the top surface of the substrate and exits the substrate through the bottom surface of the substrate.

23. The optical communications module of claim 22, wherein the circuit board has an opening formed through it, and wherein the bottom surface of the substrate of the assembly is adjacent the top surface of the circuit board and the contact pads of the second set of contact pads disposed on the bottom surface of the substrate are in contact with respective electrically-conductive contact pads disposed on the top surface of the circuit board, the VCSEL flip-chips being disposed above the opening, wherein light produce by the VCSELs passes through the opening formed through the circuit board.

24. The optical communications module of claim 23, where the front side of the ferrule device is disposed within the opening of the circuit board.

25. The optical communications module of claim 20, wherein the bottom surface of the substrate has N lenses formed therein, each lens being aligned with a respective VCSEL of a respective VCSEL flip-chip, wherein N is equal to or greater than two.

26. The optical communications module of claim 20, wherein the circuit board has an opening formed in it, and wherein the top surface of the substrate of the assembly is in contact with the top surface of the circuit board and the contact pads of the first set of contact pads disposed on the top surface of the substrate are in contact with respective electrically-conductive contact pads disposed on the top surface of the circuit board, the flip-chips being disposed within the opening.

27. The optical communications module of claim 26, wherein the front side of the ferrule device is in contact with the bottom surface of the substrate.

28. The optical communications module of claim 20, wherein the mating features disposed on the bottom surface of the substrate are balls and wherein the mating features of the ferrule device are openings shaped and sized to mate with the balls in an interference fit.

* * * * *